United States Patent [19]

Kung et al.

[11] Patent Number: 4,468,759
[45] Date of Patent: Aug. 28, 1984

[54] TESTING METHOD AND APPARATUS FOR DRAM

[75] Inventors: Roger I. Kung; Jonathan N. Spitz; Stephen T. Flannagan, all of Beaverton, Oreg.

[73] Assignee: Intel Corporation, Santa Clara, Calif.

[21] Appl. No.: 374,622

[22] Filed: May 3, 1982

[51] Int. Cl.³ .............................................. G11C 17/00
[52] U.S. Cl. ..................................... 365/201; 365/222
[58] Field of Search ............... 365/200, 201, 210, 222; 371/8, 10, 21

[56] References Cited

U.S. PATENT DOCUMENTS 4,406,013 9/1983 Reese et al. ..................... 365/222 X Primary Examiner—Joseph A. Popek
Attorney, Agent, or Firm—Blakely, Sokoloff, Taylor & Zafman

[57] ABSTRACT

A method for testing an MOS, dynamic random-access memory employing full capacitance dummy cells is described. During probe testing a potential higher than the reference potential is applied to the dummy cells when reading binary zeroes from the memory and a potential lower than the reference potential is applied to the dummy cells when reading binary zeroes from the memory. This testing procedure detects weak cells and amplifiers and helps present the packaging of defective parts. In addition, a simplified means for programming redundant elements is described which requires substantially less substrate area than previous methods.

11 Claims, 7 Drawing Figures

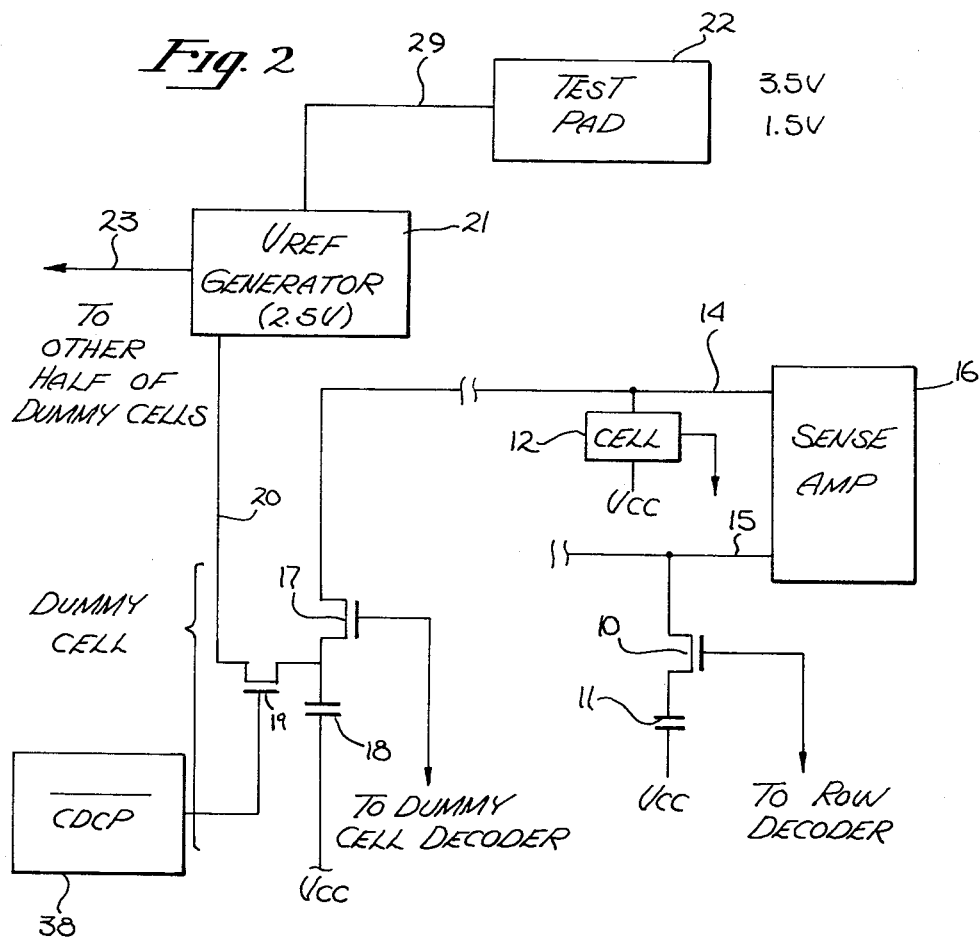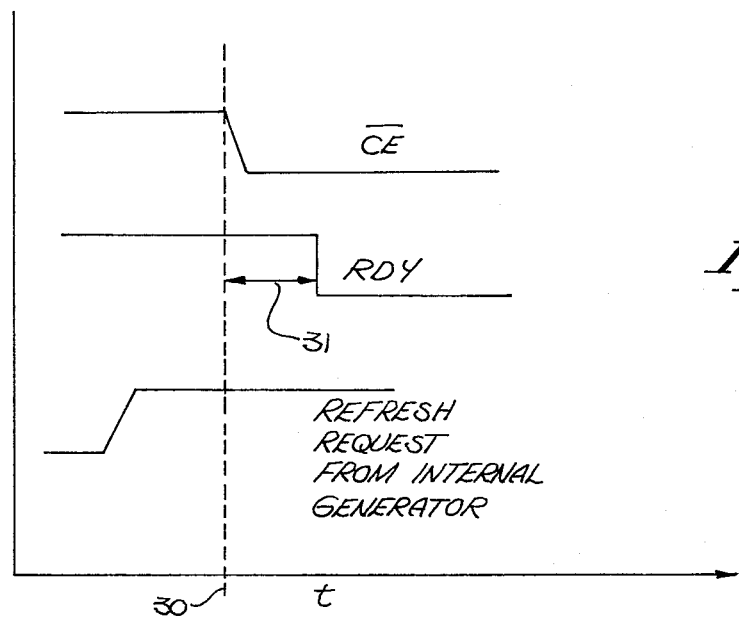

TESTING METHOD AND APPARATUS FOR DRAM

BACKGROUND OF THE INVENTION

1. Field of the Invention

The invention relates to the field of dynamic random-access memories, particularly those employing metal-oxide-semiconductor technology.

2. Prior Art

Metal-oxide-semiconductor (MOS) memories as well as other integrated circuits are fabricated on circular silicon wafers. Several hundred identical circuits are simultaneously fabricated on a typical wafer. After processing, a probe tester tests each of the circuits on the wafer to identify operative and nonoperative circuits and in some cases partially operative circuits. Then the wafer is diced, that is, cut into a plurality of separate chips. The chips are first mounted on a lead frame and after wire bonding the lead frames are placed into integrated circuit packages.

Some manufacturers fabricate redundant columns and rows (with their associated cells) on each chip to provide replacements for faulty circuits. During probe testing or even after packaging, fuses are blown on the integrated circuit, allowing the redundant circuits to replace the faulty circuits. If a sufficient number of redundant circuits exists on a given chip for replacement of all the faulty circuits a "perfect" memory may be packaged.

It is not uncommon for an integrated circuit to pass probe testing and then after being packaged to be found inoperative. This is particularly true for dynamic random-access memories. The stress associated with packaging the integrated circuits sometimes causes them to fail. More often, however, the environmental testing conducted after packaging, (e.g., high temperature and low temperature tests) reveals deficiencies in the circuits. Unfortunately, redundancy programming is not always usable after probe testing and the circuits are discarded even though a sufficient number of redundant circuits are present within the package. The packaging of an integrated circuit particularly where a ceramic package is used is often a major component in the total cost of the integrated circuit. Consequently, the packaging of integrated circuits which fail after being packaged is significant.

As will be seen, the present invention provides additional tests at probe testing in an effort to identify those circuit elements which are likely to fail after packaging particularly from environmental testing.

Some dynamic RAMs include on-chip timing generators which initiate refresh cycles. These generators operate asynchronously with the system in which the memory is used. The memory provides a "ready" signal to indicate that data may be accessed in the memory, that is, to indicate that a refresh cycle is not about to begin or is being conducted. When the memory is to be accessed, a chip enable signal is first applied to the memory, and then if the ready signal indicates that the memory is ready, an address is coupled to the memory. A problem occurs, however, when the memory is internally processing a refresh request and before the ready signal indicates that refreshing is occurring. During this period, if the memory receives a chip enable signal, an arbitration circuit within the memory must decide whether refreshing will occur or whether accessing of the memory will be permitted. In this scheme, it is necessary to know the maximum time that can lapse between the application of a chip enable signal and the possible change of state of the ready signal. Otherwise, accessing may occur during a refresh cycle. It is difficult to test a memory to determine if this period is within specification since it is not known when the refresh request signals are occurring. As will be seen, the present invention provides a test method and apparatus which permits the testing of this critical period. The same circuitry inhibits the on-chip refreshing permitting the probe tester to more easily test the memory.

During testing, as mentioned, when defective rows or columns are found, redundant rows or columns are selected for programming. Decoders are used to select redundant circuits so that they can be programmed to recognize the addresses of the faulty rows or columns. This is described, for example, in copending application Ser. No. 320,600, filed Nov. 12, 1981 entitled "Memory Redundancy Apparatus for Single Chip Memories", which is assigned to the assignee of the present application. The present disclosure describes a simplified means for selecting redundant circuits. The described apparatus and method requires substantially fewer metal lines and thus the amount of substrate area required is reduced.

SUMMARY OF THE INVENTION

An improved method for probe testing a semiconductor memory is described. The testing method is particularly useful for metal-oxide-semiconductor, dynamic, random-access memories which employ split bit lines and where each of the bit line halves is coupled to a plurality of capacitance storage cells and to a dummy cell. In such memories, a predetermined quantity of charge is coupled to one of the bit line halves by one of the dummy cells when data is accessed along the other bit line half. The improved method comprises the application of a quantity of charge other than the predetermined quantity of charge on one bit line half while reading data from the other bit line half. More specifically, a higher stored reference voltage in the dummy cells is used when reading binary ones from the memory and a lower dummy reference voltage is used when reading binary zeroes. Testing in this manner is useful in predicting the memory's performance under stressful environmental conditions such as temperature extremes. Failures are detected before packaging and thus the cost of packaging is saved or redundant circuit members are programmed at probe testing to replace weak or faulty members. In addition, a simplified means for programming redundant elements is described which requires substantially less substrate area than previous methods.

BRIEF DESCRIPTION OF THE DRAWINGS

FIG. 2 is a block diagram and electrical schematic used to describe one of the testing steps used in the present invention.

FIG. 3 illustrates waveforms associated with a dynamic random-access memory which has asynchronous refresh cycles.

DETAILED DESCRIPTION OF THE INVENTION

Figure 1:
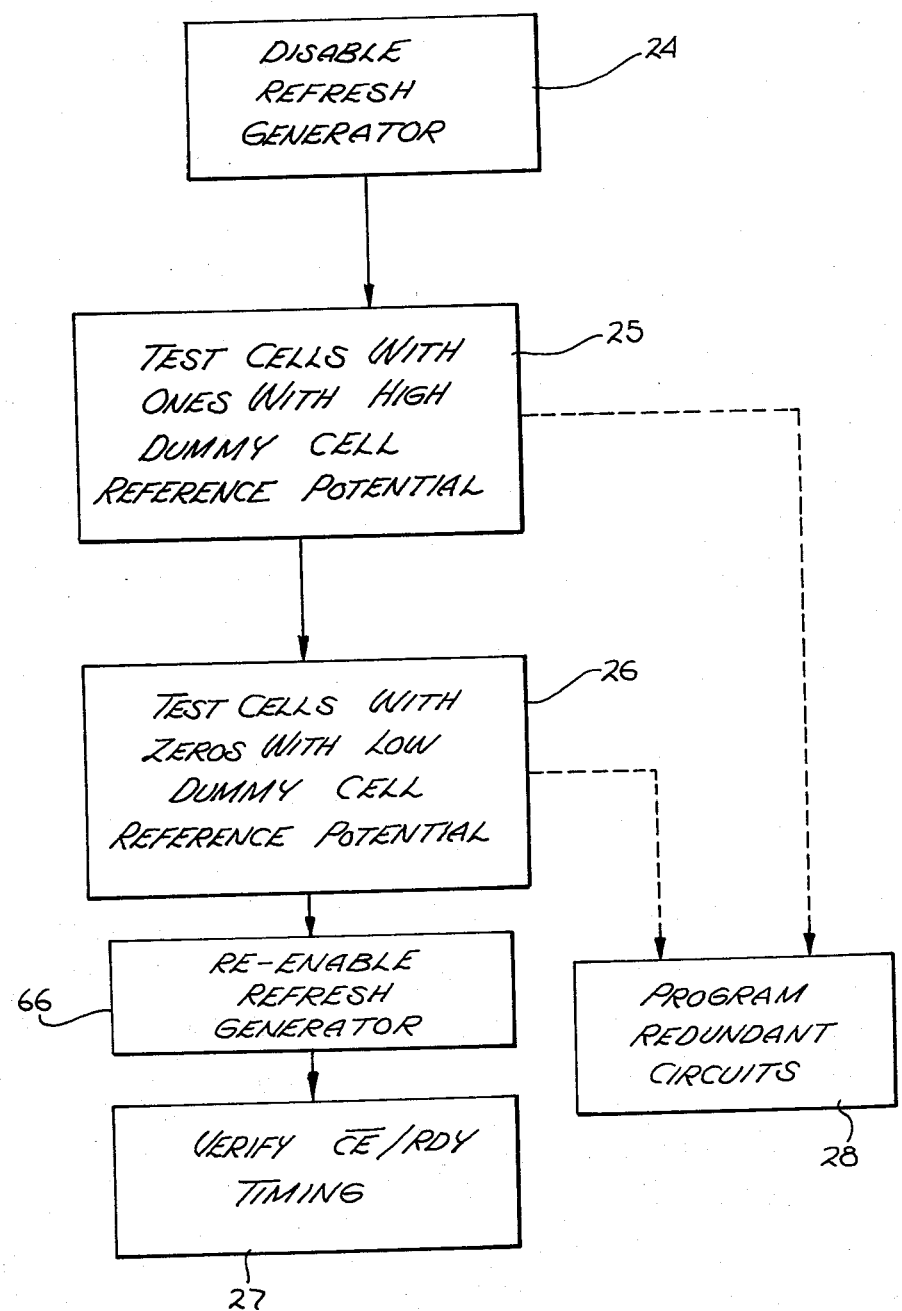
FIG. 1 illustrates the major steps implemented in the invented testing method.

A testing method and apparatus for a metal-oxide-semiconductor (MOS), dynamic, random-access memory (RAM) is described. In the following description, numerous specific details are set forth in order to provide a thorough understanding of the present invention. However, it will be obvious to one skilled in the art that the present invention may be practiced without these specific details. In other instances, well-known circuits and testing procedures are not described in detail in order not to obscure the present invention in unnecessary detail.

The presently preferred method is used for testing a 64K dynamic RAM organized as an 8×8K memory. Other aspects of this byte wide memory are described in copending application Ser. No. 373,218 filed Apr. 29, 1982, entitled "Byte Wide Dynamic RAM With Multiplexed Internal Buses" which is assigned to the assignee of the present invention. The memory is fabricated employing known MOS processing and more specifically, n-channel field-effect transistors with polycrystalline silicon gates are used.

The memory cells employed in the memory are of well-known construction and each consists of a single field-effect transistor and a capacitor for storing data in the form of electrical charge. This is shown in FIG. 2 as the transistor 10 and capacitor 11. The gate of transistor 10 is coupled to a row decoder to allow the selection of capacitor 11. A plurality of these cells are coupled to each half (lines 14 and 15) of the split bit line; for example, cell 12 is shown coupled to line 14. The split bit lines are connected to a sense amplifier 16 which most typically comprises a pair of cross-coupled field-effect transistors. A dummy cell may be coupled to either of the bit line halves. One such dummy cell which comprises the transistors 17 and 19 and capacitor 18 is shown coupled to the bit line half 14. When, for instance, data is accessed along line 15, transistor 17 conducts causing capacitor 18 to charge the line 14. The amount of charge placed on line 14 is typically midway between the charge associated with the binary one and a binary zero when read from one of the cells.

As is seen in FIG. 2, one terminal of capacitor 11 (and like capacitors) is coupled to the potential $V_{CC}$. In some memories, the dummy cell capacitor is made half as large as the memory cell capacitor and are also coupled to the potential $V_{CC}$. Consequently, when these dummy cell capacitors are coupled to a bit line half, they provide half the full charge associated with the cell capacitors. In the presently preferred embodiment, a "full C" capacitor is used in the dummy cells. That is, the capacitor 18 is equal in size to capacitor 11. To provide the half charge, capacitor 18 is coupled through transistor 19 on line 20 to a $V_{REF}$ generator 21. A charge sharing circuit is used in the presently preferred embodiment, that is, approximately half of all of the dummy cell capacitors are charged through like transistors 19 on line 20 to $V_{CC}$, the remainder of the dummy cell capacitors being discharged through like transistors 19 on line 23 to $V_{SS}$. Thus, charge is shared between the two lines and all dummy cell capacitors to provide the $V_{REF}$ potential for the dummy cells. At the beginning of the memory cycle, before any wordlines rises in potential, a CDCP/generator 38 turns off the dummy reference access transistors 19. The use of the full C dummy cells and other aspects of dynamic RAMs are described in U.S. Pat. No. 4,247,917.

In prior art memories, during probe testing, data is read into and read from each of the cells to verify the operation of the memory. Where a full C dummy cell is used the $V_{REF}$ potential from the on-chip generator provides the reference potential. This potential is constant relative to $V_{CC}$.

With the invented method and apparatus, a pad coupled to line 29 is fabricated on each of the chips. (e.g., pad 22 of FIG. 2.) During testing, a potential is applied through this pad to line 29 and through the VREF generator 21 to lines 20 and 23, overriding the reference potential generated by the aforementioned charge sharing. Consequently, the potential applied to the dummy cells is externally controlled. More specifically, during the testing of the memory, line 20 is raised to approximately 3.5 volts (assuming $V_{CC}$=5 volts), thereby causing more charge to be placed on line 14. Then, binary ones are read into and read from the cells along the line 15. It should be noted that it is more difficult to sense the binary ones from, for example, capacitor 11 because of the additional charge on line 14. Weak cells and other weak circuitry such as sense amplifiers are identified during this testing. Binary ones are also read from the cells along line 14 when this higher dummy cell potential is applied to the dummy cell coupled to line 15.

A lower potential is also applied to line 20, for instance, approximately 1.5 volts. This causes a smaller amount of charge to be placed on line 14. Then binary zeroes are read from all the cells coupled to line 15. Once again, defective cells and weak cells and other inadequate circuitry are identified. This lower potential is also applied to the dummy cell associated with line 15 and binary zeroes are also read from the cells along line 14. It has been found that testing in this manner identifies cells and other circuitry which are apt to fail during environmental testing (such as high temperature and low temperature testing.) This early identification allows replacement with redundant circuits (when available) at probe testing and reduces packaging costs.

As is well-known, dynamic, random-access memories require periodic refreshing. Often the refresh cycles are controlled external to the memory, and hence, refreshing is synchronized with system operations. However, in some cases, the memory itself includes an on-chip refresh generator which asynchronously controls refresh cycles. For these cases, the memory provides an output in response to a memory request when a refresh is occurring to indicate that the memory may not be accessed. This is identified as the "ready" (RDY) signal in this application. When the memory is to be accessed, a chip enable signal (CE/) is issued and if the RDY signal indicates that the memory is available, then address signals, etc., are provided to the memory. It, of course, takes some finite period of time for an internal refresh request signal from the refresh generator to be processed by the memory and before the state of the RDY signal changes. During this period of time, if the memory receives a chip enable signal a conflict occurs. An arbitration circuit is used to resolve this conflict; an example of one such circuit is described in copending application Ser. No. 192,740, filed Oct. 1, 1980, entitled "Byte Wide Dynamic RAM", now U.S. Pat. No.

4,406,013 (this application is assigned to the assignee of the present application.)

It is necessary to know that the RDY signal will not change state when the memory is being accessed. For system compatibility a time must be specified beyond which the RDY signal will not change state after a chip enable signal is received and before an access cycle (i.e., read or write cycle). This is shown in FIG. 3 by the waveforms; chip enable (CE/), ready (RDY) and a refresh request signal from the on-chip refresh generator. Before time 30, the signal from this generator rises indicating that a refresh cycle is necessary. This signal is processed internally by the memory and as mentioned the ready signal does not immediately change state. Assume that at time 30 the CE/ signal is received by the memory. At that precise time, it appears that the memory is in fact ready for use. In practice, however, the circuitry external to the memory waits a predetermined period of time after CE/ to verify that the memory is in fact ready. This period of time must is specified by the manufacturer. Period 31 must be less than this period of time. It is very difficult to test a memory which includes an on-chip refresh generator to verify period 31 because it is not known when refresh requests are generated.

Figure 4:
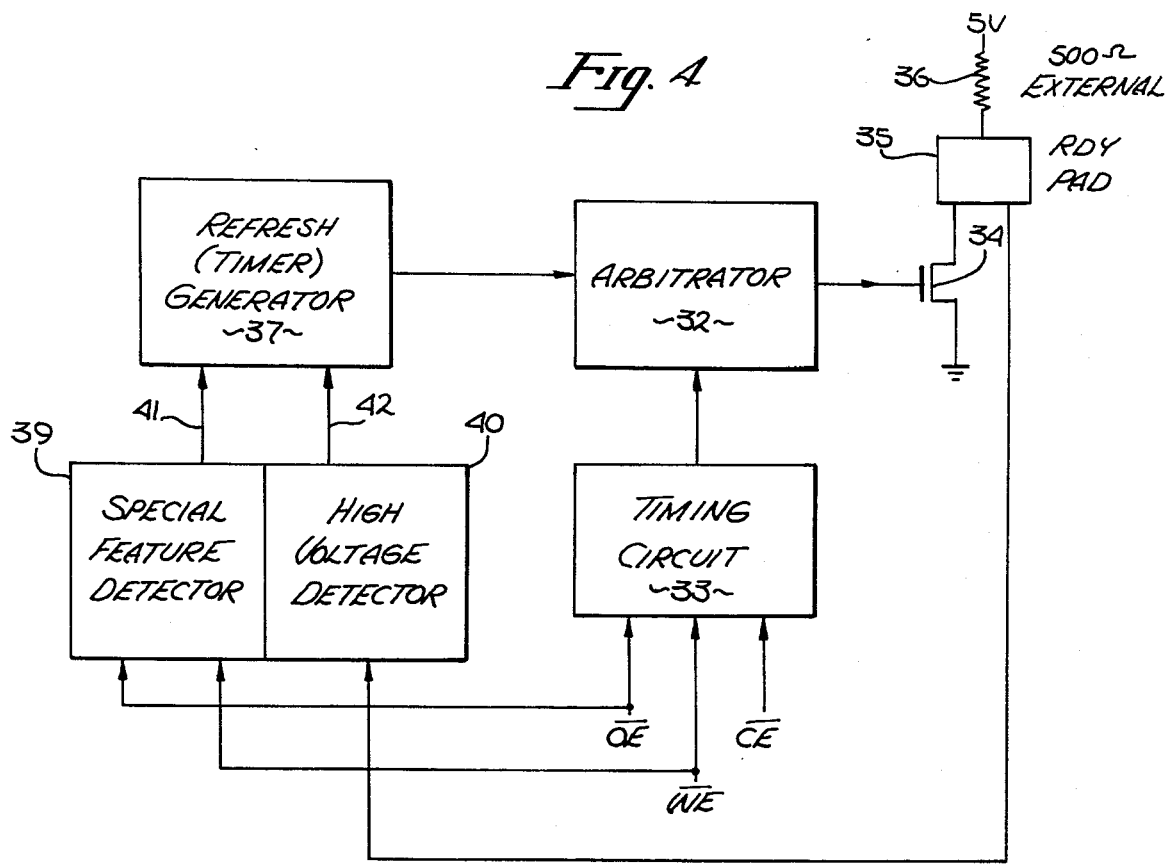
FIG. 4 is a block diagram illustrating some of the on-chip circuitry associated with the present invention.

Referring now to FIG. 4, the RDY signal is present at pad 35. This pad is coupled to a 5 volt supply through an external resistor of 500 ohms and to the memory's ground through the transistor 34. The refresh (timer) generator 37 generates the periodic refresh request signals. These signals are coupled to an arbitrator circuit 32 which also receives a signal from the timing circuits 33 to indicate when the chip has been selected. If, in response to this memory request, the arbitrator determines instead that a refresh cycle is to occur, it provides a signal to transistor 34 which couples the pad 35 to ground. On the other hand, if access of the memory is to occur, transistor 34 is prevented from conducting indicating that access is still permissible.

The timing circuits 33 receive various timing signals and for purposes of the present discussion the chip enable (CE/) signal, write enable (WE/) signal and output enable (OE/) signal are shown.

Two special circuits are added to each chip to implement the testing of the present invention. One circuit is a well-known circuit for detecting a high voltage. The high voltage detector 40 is coupled to the ready pad 35 and provides a signal to the generator 37 on line 42 when the potential on pad 35 rises above 5 volts (e.g., 12 volts). The signal on line 42 disables generator 37, that is, refreshing ceases. The special feature detector 39 detects the logical AND of the active low OE/ and WE/ signals. It then provides a signal on line 41 to the generator 37. When OE/ or WE/ returns inactive high the signal on line 41 vanishes and this causes the generator 37 to provide a refresh request signal to the arbitrator 32. It should be noted that the simultaneous drop of the OE/ and WE/ signals is an "illegal" condition and one to which the memory cannot ordinarily act. This illegal condition does, however, provide a convenient way to activate generator 37 during testing without requiring an additional pad.

Figure 5:
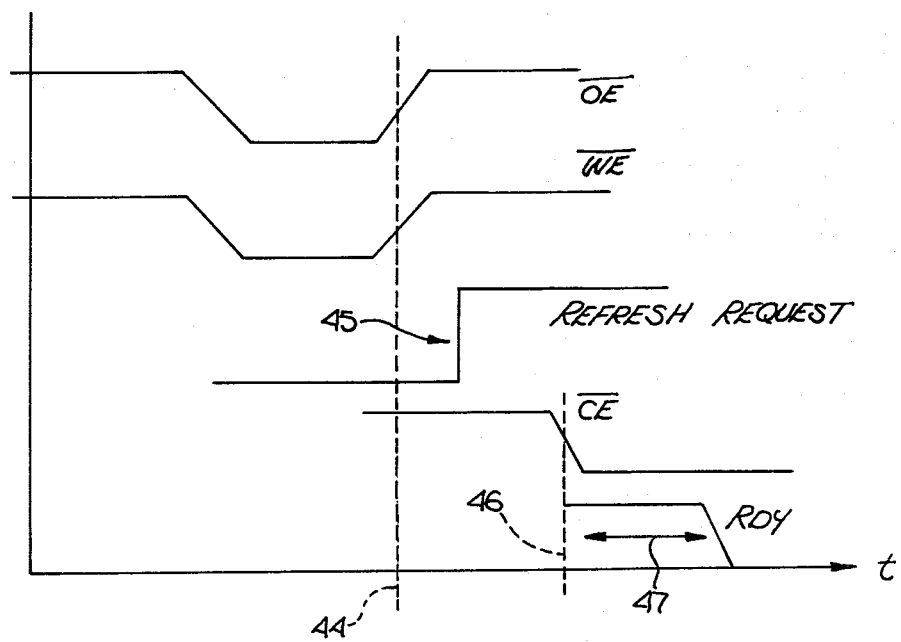
FIG. 5 illustrates waveforms used to explain the operation of the diagram of FIG. 4.

Referring to FIG. 5, if the OE/ and WE/ signals drop in potential and then raise in potential as shown at time 44 a pulse is sent to generator 37 via line 41. This causes the generator 37 to generate a refresh request signal shown with the leading edge 45. At time 46 the CE/ signal is lowered in potential indicating that the chip is to be enabled. The period between this drop and the drop of the RDY signal (period 47) is measured. If the timing circuits, refresh generator and arbitrator are properly functioning this period 47 should be no more than a predetermined period which for the presently preferred embodiment is 50 nanoseconds. (The CE/ signal drops in potential approximately 50 nanoseconds after the OE/ and WE/ signals rise in potential in the current test.)

The high voltage signal on pad 35 is useful during the testing described in conjunction with FIG. 1. Since this signal disables the generator 37, the probe tester can be programmed to test the RAM without concern that refreshing may occur. Without disabling this generator, the probe tester would have to constantly determine whether or not it could access the memory for test purposes and this would not only complicate the tester's programming but consume additional time.

Referring to FIG. 1, the testing described by this application is shown within blocks 25, 26 and 27. The specific order in which the testing of blocks 25, 26 and 27 is performed is not critical and the order may be varied. Also tests other than those shown in FIG. 1 may be performed.

First, as shown by block 24, the refresh generator 37 of FIG. 4, is disabled. This is done by applying a high potential to the pad 35.

Then the testing described in conjunction with FIG. 2 is performed. As shown by block 25, the cells are tested by reading binary ones from the cells when the high dummy cell reference potential is used. If defective or weak cells (or other circuits) are found, the redundant circuits are programmed to replace the weak or defective circuits as indicated by block 28. The cells are tested with binary zeroes with a low dummy cell reference potential as shown by block 26. Again, redundancy may be employed to replace faulty elements.

Then, as shown by block 66, the refresh generator 37 of FIG. 4 is re-enabled by removing the high potential on pad 35 and removing the VCC supply to power down the device and then reapplying VCC power up again without the high potential on pad 35. Next, as shown by block 27, the duration between the CE/ signal and the drop of the RDY signal is measured. This is done as shown in FIGS. 4 and 5 by activating the special feature detector.

Figure 6:
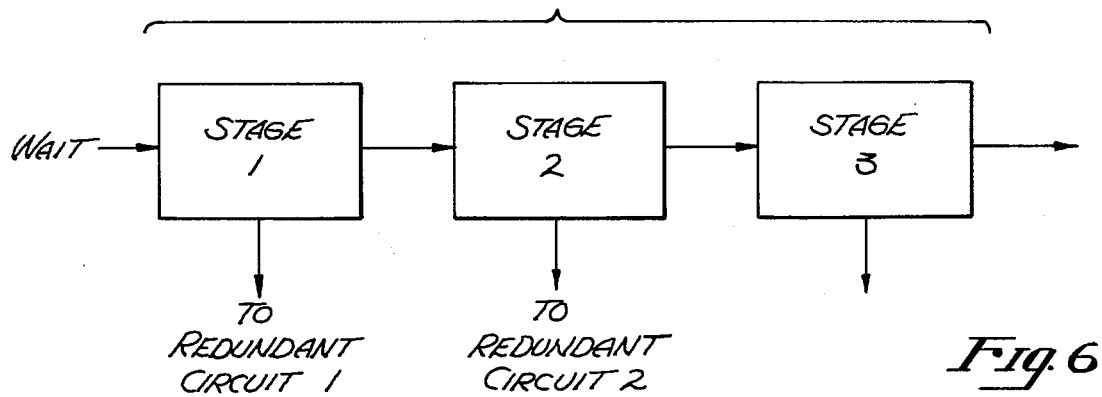
FIG. 6 is a block diagram of the circuitry used for the selection of redundant circuits.

In the presently preferred embodiment, the circuits are selected for redundancy programming by a shift register such as the one shown in FIG. 6. A static shift register is preferred as opposed to a dynamic shift register, charge-coupled device or bucket brigade device. Each output stage of the shift register is coupled to a fuse programming transistor. An input signal is placed into the first stage and is shifted to the stage associated with the fuse selected for programming. This, as mentioned, provides an advantage over the prior art technique of using decoders and address signals to select each fuse for programming.

Figure 7:
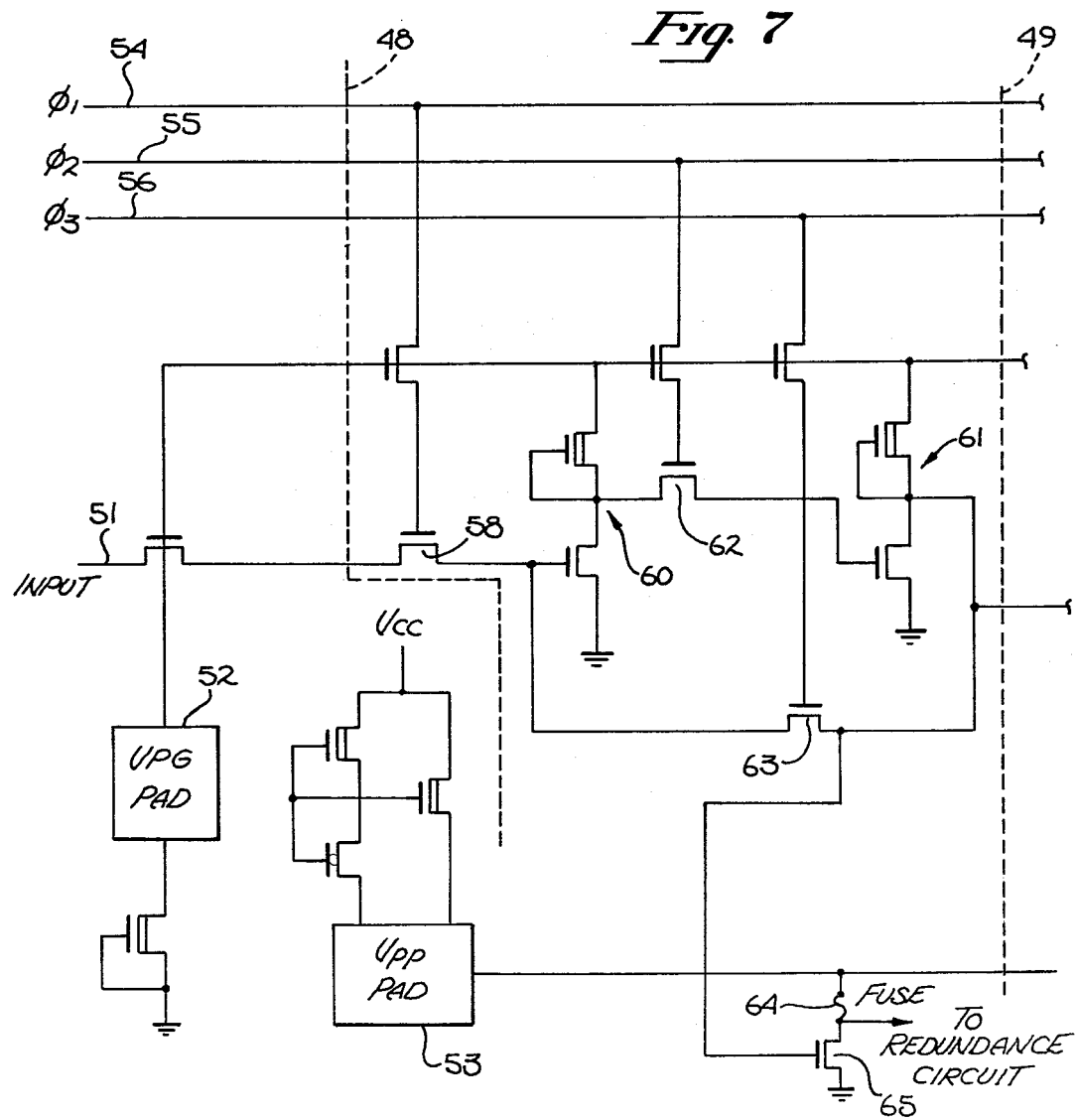
FIG. 7 is an electrical schematic of a portion of the block diagram of FIG. 6.

The specific shift register employed in the present invention is shown in FIG. 7. The input circuitry for the shift register is shown to the left of line 48 and a single stage of the shift register is shown between lines 48 and 49. The stage between lines 48 and 49 is duplicated for each redundant fuse.

Four input pads are used to input data into the shift register and to shift it. One pad is coupled to line 51 and the others to lines 54, 55 and 56. Each stage of the register includes a transistor 58 for controlling the input flow through the $\phi_1$ signal, a pair of inverters such as inverters 60 and 61 controlled by the $\phi_2$ signal through transistor 62, and a regenerative loop completed through transistor 63 and controlled by the $\phi_2$ and $\phi_3$ signals when the $\phi_1$ signal is low.

Initial testing of all redundant elements (rows and columns) is possible when the $V_{PP}$ pad (pad 53) is brought to ground potential (all fuses appear blown).

Before any of the circuits are programmed, first the register must be cleared. This is done with the pad 53 coupled to ground to prevent possible blowing of fuses along the register such as fuse 65. Lines 51 and 56 are coupled to ground while lines 54 and 55 receive a positive potential (e.g., 5 volts). Then the $V_{PG}$ (pad 52) is raised to 12 volts. This condition is maintained for sufficient time for a zero to ripple through the stages and ensure a complete reset. In the presently preferred embodiment, with 64 stages a period greater than 640 nanoseconds is required.

To blow a particular fuse, line 55 is brought to ground to isolate each of the stage's inverters and then a high input signal is applied to line 51. Following this, line 54 is brought to ground potential to isolate the signal in inverter 60. Next line 55 is raised in potential to couple a signal to Inverter 61, and line 56 is then brought up to complete then regenerative static loop. Now the binary one has been loaded into the first stage and it is possible to blow fuse 64. (Note inverter 61 is not conducting and thus the gate of transistor 65 is at 12 V.) To blow the fuse, a series of positive pulses are applied to pad 53 causing current to flow from pad 53 through transistor 65 blowing fuse 64. If this fuse is not to be blown, the input line 51 would be brought to ground potential and the binary one in the first stage shifted to the appropriate stage to blow the selected fuse. Therefore, any of the fuses may be blown allowing selection of any address for any of the redundant circuit elements.

As mentioned, by employing the above-described shift register in lieu of the prior art decoders, substrate area is saved.

Thus, a testing method and apparatus has been described which is particularly useful in identifying marginal circuits at probe test. Other techniques are described which allow the testing of the timing circuitry where an on-chip refresh generator is employed.

We claim:

1. In a metal-oxide-semiconductor, dynamic, random-access memory employing first and second bit lines, where each of said bit lines is coupled to a plurality of capacitance storage memory cells and to a first and second dummy cell respectively, and where during normal memory operation a predetermined quantity of charge is coupled to one of said first and second bit lines by one of said first and second dummy cells when data is accessed along the other of said first and second bit lines, an improved method for testing said memory comprising the steps of:
   applying a quantity of charge different than said predetermined quantity of charge to said one bit line through said one dummy cell; and,
   accessing data during said testing from memory cells coupled to said other bit line,
   whereby said charge different than said predetermined charge used during said normal memory operation causes data to be more difficult to reliably access from said memory with the results of said accessing of said data providing a prediction of said memory's performance during normal operation in stressful environmental conditions.

2. The method defined by claim 1 wherein said different quantity of charge is larger than said predetermined quantity when binary ones are accessed during said testing of said memory and wherein said different quantity of charge is lowered when binary zeroes are accessed during said testing of said memory.

3. The method defined by claim 2 wherein said testing is conducted such that a binary one and a binary zero is read from each of said memory cells.

4. In a metal-oxide-semiconductor, dynamic, random-access memory employing first and second bit lines coupled to a sense amplifier, where each of said bit lines is coupled to a plurality of capacitance storage memory cells, and where a predetermined potential is applied to one of said first and second bit lines during normal memory operation when data is accessed along the other of said first and second bit lines; an improved method for testing said memory comprising:
   applying a potential different than said predetermined potential to said one bit line;
   accessing data during said testing from memory cells coupled to said other bit line to determine if said accessed data is the same as data stored in said memory cells thereby determining if said memory can operate with said different potential;
   whereby said memory is tested so as to predict said memory's performance under stressful environmental conditions.

5. The method defined by claim 4 wherein said different potential is greater than said predetermined potential when binary ones are accessed during testing of said memory and wherein said different potential is lower than said predetermined potential when binary zeroes are accessed during testing of said memory.

6. The method defined by claim 5 wherein said testing is conducted such that a binary one and a binary zero is read from each of said memory cells.

7. The method defined by claim 6 wherein said memory includes a timing means for providing refresh request signals used to initiate a refresh cycle.

8. The method defined by claim 7 wherein said memory is activated by a chip enable signal and provides a ready signal indicating that data may be accessed, and including the following additional steps:
   causing said timing means to generate one of said refresh request signals;
   applying a chip enable signal to said memory; and
   measuring the time between the application of said chip enable signal and a change of state of said ready signal.

9. In a metal-oxide-semiconductor, dynamic, random-access memory which includes a plurality of capacitance storage memory cells requiring periodic refreshing, said memory being disposed on a substrate along with a generator for providing refresh request signals which initiate refereshing cycles, said memory being adapted to receive a chip enable signal to enable memory access and for providing a ready signal which when in a first state indicates that data may be accessed from said memory, an improved testing method for testing said memory comprising the steps of:
   determining when one of said refresh request signals is provided from said generator;
   applying a chip enable signal to said memory; and,
   measuring the time between the application of said chip enable signal and a change of state of the ready signal to said first state indicating that data may be accessed from said memory;

whereby circuitry on said memory is tested to determine if said circuitry can resolve the conflicting request for said refresh from said refresh signal and accessing caused by said chip enable signal.

10. The method defined by claim 9 wherein said step of determining when said signal is provided by said generator includes the steps of:
   causing said generator to generate a single one of said refresh request signals.

11. In a memory which includes a plurality of redundant circuits which are coupled into said memory during testing when said testing shows that other circuits are inoperative, an apparatus for selecting said redundant circuits for said coupling into said memory, comprising:
   a shift register having a plurality of stages, one of said stages for each of said redundant circuits;
   a plurality of fuses, at least one of said fuses for each of said stages, said fuses being coupled to its respective one of said stages of said shift register,
   first circuit means coupled to each of said fuses and each of said stages for selectively blowing said fuses if said stage contains a predetermined binary signal and if said first circuit means receives a certain signal; and,
   second circuit means for inserting said predetermined binary signal into said register and for shifting said predetermined binary signal to said stages of said shift register;
   whereby said redundant circuits are selected by said shifting of said predetermined binary signal in said shift register and are coupled into said memory by application of said certain signal.

* * * * *